United States Patent
Magerl et al.

(10) Patent No.: US 9,729,136 B2
(45) Date of Patent: Aug. 8, 2017

(54) CIRCUIT ARRANGEMENT AND METHOD FOR CONTROLLING SEMICONDUCTOR SWITCHING ELEMENT

(71) Applicant: FRONIUS INTERNATIONAL GmbH, Pettenbach (AT)

(72) Inventors: Christian Magerl, Langschlag (AT); Benjamin Schranz, Schleissheim (AT); Jan Herndler, Scharnstein (AT); Andreas Hoegl, Buchkirchen (AT)

(73) Assignee: FRONIUS INTERNATIONAL GmbH, Pettenbach (AT)

( * ) Notice: Subject to any disclaimer, the term of this patent is extended or adjusted under 35 U.S.C. 154(b) by 33 days.

(21) Appl. No.: 14/712,128

(22) Filed: May 14, 2015

(65) Prior Publication Data

US 2015/0333749 A1   Nov. 19, 2015

(30) Foreign Application Priority Data

May 15, 2014  (AT) .............................. A 50341/2014

(51) Int. Cl.
  *H03K 17/567* (2006.01)
  *H03K 17/687* (2006.01)
  (Continued)

(52) U.S. Cl.
  CPC ......... *H03K 17/163* (2013.01); *H03K 17/567* (2013.01); *H03K 17/687* (2013.01);
  (Continued)

(58) Field of Classification Search
  CPC .. H03K 17/163; H03K 17/567; H03K 17/687; H03K 17/168; H03K 17/61; H03K 17/691
  (Continued)

(56) References Cited

U.S. PATENT DOCUMENTS 4,461,966 A * 7/1984 Hebenstreit .......... H03K 17/691
                                                327/432
4,540,893 A    9/1985 Bloomer
(Continued)

FOREIGN PATENT DOCUMENTS

DE   10 2012 218284   4/2014
EP   0 053 709        6/1982
(Continued)

OTHER PUBLICATIONS

Lobsiger et al., "Closed-Loop di/dt &dv/dt Control and Dead Time Minimization of IGBTs in Bridge Leg Configuration," Proceedings of the 14$^{th}$ IEEE Workshop on Control and Modeling for Power Electronics (COMPEL 2013), Salt Lake City, USA (Jun. 23-26, 2013)

(Continued)

*Primary Examiner* — Brandon S Cole
(74) *Attorney, Agent, or Firm* — Greenblum & Bernstein, P.L.C.

(57) ABSTRACT

In order to reduce the problems with sharp-edged control voltages of semiconductor switching elements, it is provided that the control terminal (6) of the semiconductor switching element (1) is connected to the output terminal (7) of the semiconductor switching element (1) via a ramp generation unit (5), and the ramp generation unit (5) flattens the sharply ascending and descending edges of the driver control voltage ($V_S$) into the form of a ramp, in order to generate a transistor control voltage ($V_G$) at the output of the ramp generation unit (5).

6 Claims, 7 Drawing Sheets

(51) Int. Cl.
*H03K 17/61* (2006.01)
*H03K 17/691* (2006.01)
*H03K 17/16* (2006.01)

(52) U.S. Cl.
CPC .......... *H03K 17/168* (2013.01); *H03K 17/61* (2013.01); *H03K 17/691* (2013.01)

(58) Field of Classification Search
USPC ............ 327/108–112, 365–508; 326/22–27, 326/81–87
See application file for complete search history.

(56) References Cited

U.S. PATENT DOCUMENTS

| | | | | |
|---|---|---|---|---|
| 4,634,903 | A * | 1/1987 | Montorfano | H02M 3/155 323/283 |
| 5,729,446 | A * | 3/1998 | Gruning | H02M 1/08 363/54 |
| 6,956,427 | B2 * | 10/2005 | Kawasaki | H03K 17/691 327/427 |
| 2003/0146714 | A1 * | 8/2003 | Buonocunto | H02J 9/065 315/247 |
| 2006/0044025 | A1 * | 3/2006 | Grbovic | H03K 17/0406 327/112 |
| 2008/0054984 | A1 * | 3/2008 | Lee | H03K 17/166 327/419 |
| 2010/0208500 | A1 * | 8/2010 | Yan | H02M 3/33523 363/21.12 |
| 2011/0291575 | A1 * | 12/2011 | Shiu | H05B 33/0815 315/192 |
| 2013/0063185 | A1 * | 3/2013 | Ye | H02M 3/33569 327/108 |
| 2013/0076406 | A1 * | 3/2013 | Xu | H02M 1/08 327/109 |
| 2013/0148388 | A1 * | 6/2013 | Yang | H02M 3/33507 363/21.17 |
| 2014/0111261 | A1 * | 4/2014 | Daigo | H03K 17/14 327/161 |
| 2014/0145779 | A1 * | 5/2014 | Gediga | H03K 17/14 327/378 |
| 2014/0240007 | A1 * | 8/2014 | Gibson | H03K 17/00 327/109 |
| 2014/0320194 | A1 * | 10/2014 | Rozman | H03K 17/167 327/382 |

FOREIGN PATENT DOCUMENTS

| | | |
|---|---|---|
| EP | 0 751 611 | 1/1997 |
| JP | 3 066754 | 7/2000 |
| JP | 2003 069406 | 3/2003 |
| JP | 2003 125574 | 4/2003 |
| WO | 2012/007558 | 1/2012 |

OTHER PUBLICATIONS

Austria Search Report conducted in counterpart Austria Appln. No. A 50341/2014 (Mar. 12, 2015).
European Search Report conducted in counterpart Europe Appln. No. EP 15 16 7507 (Oct. 2, 2015).

* cited by examiner

CIRCUIT ARRANGEMENT AND METHOD FOR CONTROLLING SEMICONDUCTOR SWITCHING ELEMENT

CROSS-REFERENCE TO RELATED APPLICATIONS

The present application claims priority under 35 U.S.C. §119(a) of Austrian Patent Application No. A 50341/2014 filed May 15, 2014, the disclosure of which is expressly incorporated by reference herein in its entirety.

BACKGROUND OF THE INVENTION

1. Field of the Invention

The present invention relates to a circuit arrangement for controlling a semiconductor switching element, wherein a gate driver generates a sharp-edged control voltage for the semiconductor switching element, and the gate driver is connected to the control terminal of the semiconductor switching element.

2. Discussion of Background Information

Active semiconductor switching elements, and in particular transistors such as an insulated-gate bipolar transistor (IGBT) or a metal-oxide-semiconductor field-effect transistor (MOSFET) are often switched by using so-called gate drivers that are connected to the control terminal of the semiconductor switching element (a gate terminal, in the case of an IGBT or a MOSFET) and that generate a driver control voltage in order to control the current flow through the semiconductor switching element. A conventional standard gate driver generates a sharp-edged square wave voltage as driver control voltage. The semiconductor switching element is thereby controlled without regard to the respective switching behavior. This can lead to undesired oscillations, problems caused by high-frequency electromagnetic radiation, or even destruction of the semiconductor switching element. On the other hand, such standard gate drivers are commercially available as hardware modules at low cost.

The prior art already includes some solutions for eliminating or reducing the aforementioned problems of such standard gate drivers.

Patent document WO 2012/007558 A1 discloses a method and arrangement for controlling power MOS transistors. There, the transistor is controlled in order to switch off with a linearly descending control voltage and switch on with a linearly ascending control voltage—that is, each with a voltage ramp, in lieu of the sharp-edged driver control voltage. In terms of the circuitry, this is achieved by an impedance transformer having an amplifier, current sources, and a capacitor, i.e., by a complex electrical circuit.

It has likewise been proposed to actively regulate the voltage edges of the control voltage of the semiconductor switch through a closed control loop, such as in Lobsiger Y. et al., "Closed Loop di/dt & dv/dt Control and Dead Time Minimization of IGBTs in Bridge Leg Configuration," Proceedings 14th IEEE Workshop on Control and Modeling for Power Electronics (COMPEL 2013), Salt Lake City, USA, Jun. 23-26, 2013. Such active regulation for a gate driver, however, is costly on the hard hardware and software side.

The two concepts above are also alike in that both propose a completely new circuit for a gate driver, and this completely new circuit needs to be developed and implemented as hardware, possibly with suitable control software. Existing cost-effective standard gate driver modules, therefore, can no longer be used, but instead must be replaced by newly developed ones.

SUMMARY OF THE EMBODIMENTS

The present invention addresses the problem of reducing the aforementioned problems in the switching of semiconductor switching elements using a conventional gate driver in a simple and cost-effective manner.

This problem is solved according to the invention in that: the control terminal of the semiconductor switching element is connected to the output terminal of the semiconductor switching element via a ramp generation unit; in order to generate a transistor control voltage at the output of the ramp generation unit, the sharply ascending and descending edges of the driver control voltage are flattened into the form of a ramp by the ramp generation unit; and energy is supplied to the ramp generation unit through the gate driver. A standard gate driver can thus be used for the control of the semiconductor switching element, as before, wherein the disadvantages of the sharp-edged driver control voltage are reduced by the flattening of the sharp edges in the ramp generation unit. The ramp generation unit is a simple, electrical additional circuit and does not require an elaborate reworking of the gate driver, but can instead be simply added between the gate driver and the semiconductor switching element, thereby making it possible to very easily adapt electrical circuits using standard electrical components.

A signal transformer may also be switched between the gate driver and the ramp generation unit, for the purpose of potential isolation.

In a particularly preferred embodiment, a transistor is arranged on the output side of the ramp generation unit, the transistor being controlled by a voltage that ascends in the form of a ramp or a voltage that descends in the form of a ramp, whereby a transistor current that descends or ascends in the form of a ramp flows via the transistor. The ramp-shaped current through the transistor thus branches off from the output current of the ramp generation unit, thereby causing the output current to also ascend or descend in the form of a ramp. This then brings about a transistor control voltage at the output of the ramp generation unit, with edges that ascend and descend in the form of a ramp; the sharp edges of the driver control voltage are thereby flattened.

The ramp-shaped voltage for controlling the transistor is advantageously generated by providing a first transistor and a resistor-capacitor (RC) charging circuit in the ramp generation unit, wherein the transistor output terminal of the first transistor is connected to the output terminal of the ramp generation unit, the RC charging circuit is connected to the input ter urinal of the ramp generation unit via the resistor, and the capacitor of the RC charging circuit is connected to the transistor control terminal of the first transistor. This can be achieved in the simplest manner with standard electrical components. Simple dimensioning of the RC charging circuit also makes it possible to easily control the action of flattening the sharp edges of the driver control voltage.

In another embodiment of the invention, a first transistor, a second transistor, and a resistor-capacitor (RC) charging circuit are provided in the ramp generation unit, wherein: the transistor output terminals of the first transistor and of the second transistor are connected to one another and to the output terminal of the ramp generation unit; the transistor control terminal of the second transistor is connected to the input terminal of the ramp generation unit; the RC charging circuit is connected to the input terminal of the ramp generation unit via the resistor; and the capacitor of the RC charging circuit is connected to the transistor control terminals of the first transistor and of the second transistor. This circuit has an advantage in that by a reasonable addition of circuitry complexity in form of the additional transistors, the performance burden of the gate driver can be reduced by the ramp generation unit.

BRIEF DESCRIPTION OF THE DRAWINGS

The present invention shall now be described in greater detail, with reference to FIGS. 1 to 14, which, by way of example, illustrate advantageous embodiments of the invention in a schematic and non-restrictive manner.

DETAILED DESCRIPTION OF THE EMBODIMENTS

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description taken with the drawings making apparent to those skilled in the art how the several forms of the present invention may be embodied in practice.

Figure 1:
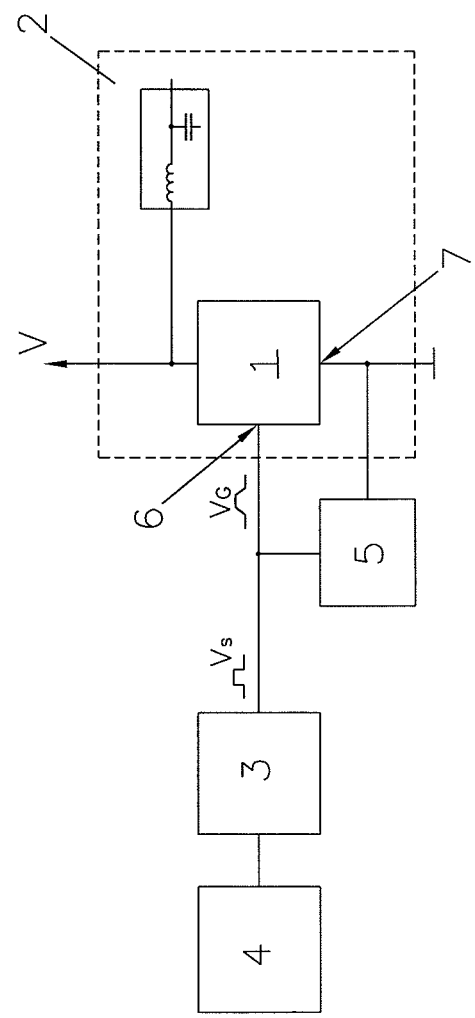
FIG. 1 illustrates a circuit arrangement for controlling a semiconductor switching element according to the invention.

As is schematically depicted in FIG. 1, a semiconductor switching element 1 is used, for example, as an electronic switch in an electrical circuit 2, for example, a DC-DC converter, as indicated in FIG. 1. In particular, such semiconductor switching elements 1 are found in power electronics, for example, in DC/AC converters, AC/DC converters, or DC/DC converters for various uses, e.g., in a charging device in the kW range, a welding device, or a power inverter of a photovoltaic system. Such power electronics circuits share the fact that the semiconductor switching element 1 must be switched at a high frequency. A standard gate driver 3 is used in order to switch the semiconductor switching element 1; at the output, under the control of a control unit 4, the standard gate driver 3 generates a sharp-edged driver control voltage $V_S$ of a certain frequency in order to control the semiconductor switching element 1. The driver control voltage $V_S$ is applied to the control terminal 6 of the semiconductor switching element 1, in order to control the current flow via the semiconductor switching element 1 in accordance with the predetermined switching behavior of the semiconductor switching element 1. On the input side, the gate driver 3 is controlled by a control unit 4, for example, by means of pulse width modulation (PWM). Such power electronics circuits 2 are well known so there is no need to provide a more detailed description here.

A ramp generation unit 5 according to the invention is connected between a control terminal 6 and an output terminal 7 (e.g., an emitter terminal in the case of an IGBT or a source terminal in the case of a MOSFET) of the semiconductor switching element 1; the ramp generation unit 5 ensures that the voltage rise of the square edges of the sharp-edged driver control voltage $V_S$ from the standard gate driver 3 is reduced. The output terminal 7 is typically at a reference potential, such as a zero potential. A transistor control voltage $V_G$ that has defined ascending and descending ramps is intended to be generated thereby, in contrast to the sharp edges of the driver control voltage $V_S$. The electrical power for operating the ramp generation unit 5 comes directly from the gate driver 3, so that there is no need to provide any additional supply voltage input for the ramp generation unit 5. The ramp generation unit 5 is an electrical additional circuit which, despite posing a burden on the gate driver 3 in terms of performance (because the gate driver 3 provides the electrical energy for the ramp generation unit 5), also ensures that a standard gate driver 3 can be used and that only the disadvantages associated with the sharp-edged driver control voltage $V_S$ are eliminated. Possible implementations of the ramp generation unit 5 shall be described below, with reference to FIGS. 2 and 3.

The basic idea of the ramp generation unit 5 lies in applying the driver control voltage $V_S$ delivered from the gate driver 3 to the input side of the ramp generation unit 5 and arranging the transistor T1 at the output side of the ramp generation unit 5, wherein the transistor T1 is controlled either by a voltage ascending in the form of a ramp (at an ascending edge of the driver control voltage $V_S$) or a voltage descending in the form of a ramp (at a descending edge of the driver control voltage $V_S$), so that a transistor current $I_1$ that descends or ascends in the form of a ramp flows through the transistor T1. Since the transistor T1 is connected to the output 11 of the ramp generation unit 5, the waveform of the transistor current $I_1$ predetermines the waveform of the output current $I_G$ of the ramp generation unit 5, and hence also the waveform of the transistor control voltage $V_G$, with which the semiconductor switching element 1 is controlled. A transistor current $I_1$ ascending or descending in the form of a ramp thus brings about an output current $I_G$ that ascends or descends in the form of a ramp, and consequently also a transistor control voltage $V_G$ that ascends or descends in the form of a ramp.

Figure 2:
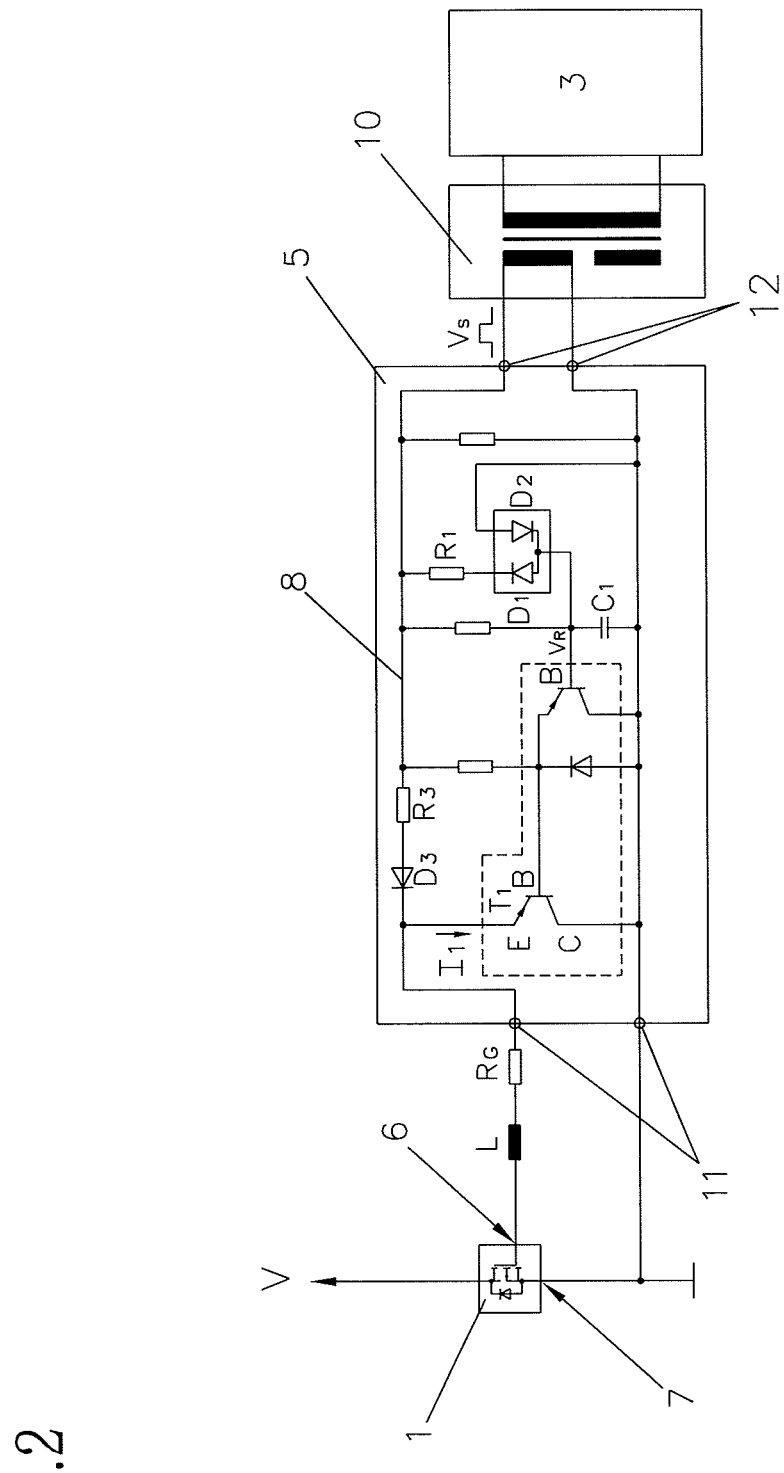
FIG. 2 illustrates an embodiment of the ramp generation unit according to the invention.
Figure 3:
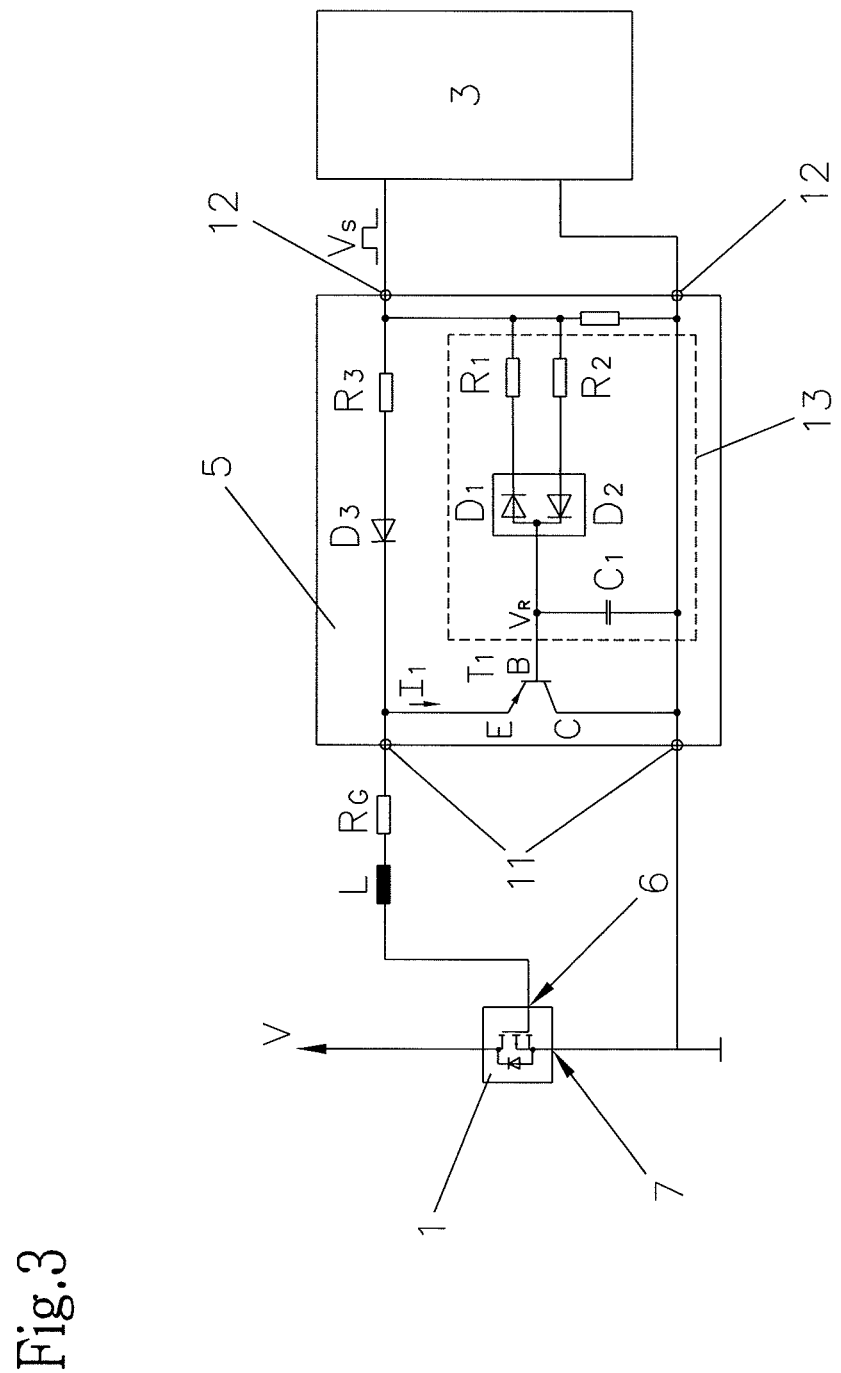
FIG. 3 illustrates an alternative embodiment of the ramp generation unit according to the invention.

In the embodiment according to FIG. 2, a signal transformer 10 having potential isolation is provided for signal transmission between the gate driver 3 and the ramp generation unit 5, while in the embodiment according to FIG. 3, no potential isolation is provided and the gate driver 3 is connected directly to the ramp generation unit 5. In both cases, the ramp generation unit 5 is supplied with electrical power exclusively by the gate driver 3. A gate resistor $R_G$ and also an inductor L (e.g., a known multilayer ferrite for filtering EMV interference) may be provided before the control terminal 6 of the semiconductor switching element 1 in a known manner. In the following description, applicable protective circuitry in the ramp generation unit 5, such as diodes and resistors, shall be discussed only where it is relevant to the function of the ramp generation unit 5 according to the invention. Otherwise, it may be assumed that a person skilled in the art will recognize the function of the protective circuitry.

The ramp generation unit 5 comprises input terminals 12 and output terminals 11. One of the input terminals 12 and one of the output terminals 11 are connected to one another and to a reference potential, such as a zero potential, in a known manner, for which reason the following discussion shall pertain also to an input terminal 12 and an output terminal 11. The output of the gate driver 3 or the output of the signal transformer 10 is connected to the input terminal 12. In the ramp generation unit 5 in the illustrated embodiments according to FIGS. 2 and 3, an input terminal 12 is connected to an output terminal 11 via a line 8 in which a current-limiting resistor R3 and optionally a diode D3 are arranged. In the ramp generation unit 5, a transistor T1, which here is a PNP bipolar transistor, is connected in parallel to the output terminal 11 of the ramp generation unit 5. The transistor T1 is thus connected between the line 8 and the reference potential, and therefore branches off from the line 8. Instead of a PNP bipolar transistor, it shall be readily understood that it would also be possible to use another transistor type for the transistor T1.

In FIG. 2, the transistor T1 is embodied as a known Darlington pair circuit by means of two transistors, also known as a Darlington transistor; however, this has no special significance for the invention. The Darlington transistor of FIG. 2 is also generally referred to here as the transistor T1.

The transistor T1 here is connected to the transistor output terminal E, for example, an emitter terminal, and the transistor input terminal C, for example, a collector terminal, (at the output-side transistor of the Darlington pair circuit, in the case of a Darlington transistor), between the output terminals 11 of the ramp generation unit 5. The transistor output terminal E of the transistor T1 is then connected to the control terminal 6 of the semiconductor switching element 1, optionally via the gate resistor $R_G$ and the inductor L.

An RC charging circuit 13 composed of a capacitor C1 and resistors R1, R2 is connected to the transistor control terminal B, for example, a base terminal, of the transistor T1 (at the input-side transistor of the Darlington circuit pair, in the case of a Darlington transistor). The resistors R1, R2 are switched on via the diodes D1, D2 respectively connected in series to a resistor R1, R2, in accordance with the current direction. The capacitor C1 of the RC charging circuit 13 is connected between the transistor control terminal B and the transistor input terminal C of the transistor T1 (at the input-side transistor, in the case of a Darlington transistor). The RC charging circuit 13 is also connected to the input of the ramp generation unit 5, by the connection of the resistors R1, R2 to the input terminal 12.

Figure 4:
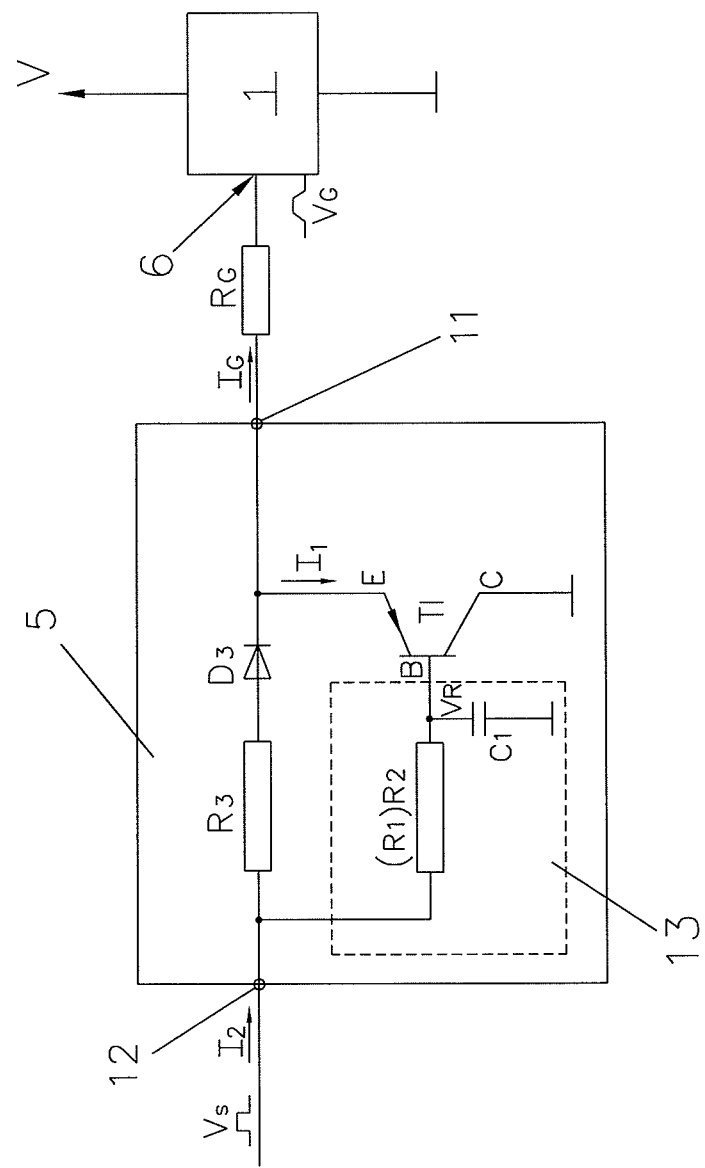
FIG. 4 illustrates a simplified representation of a ramp generation unit according to the invention.

The function of the ramp generation unit 5 shall now be described with reference to FIG. 4, which illustrates the ramp generation unit 5 in a simplified manner, and FIGS. 5 to 8, which illustrate characteristic signal patterns.

Figure 5:
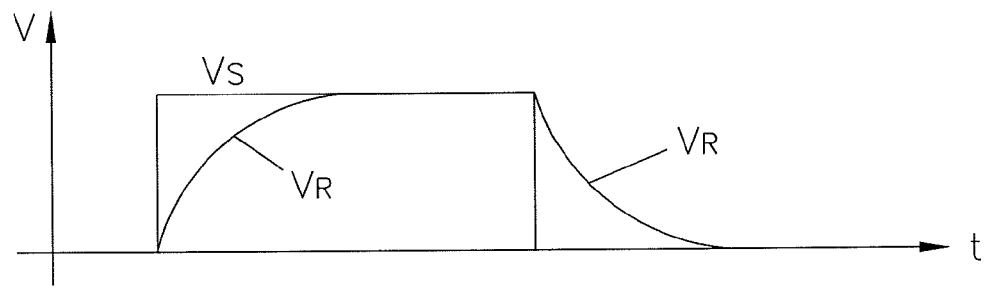
FIGS. 5 to 8 illustrate curves of the characteristic currents and voltages of the ramp generation unit.
Figure 6:
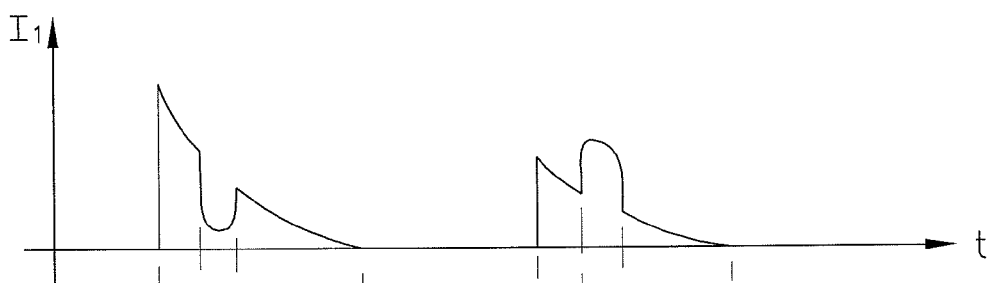
Figure 7:
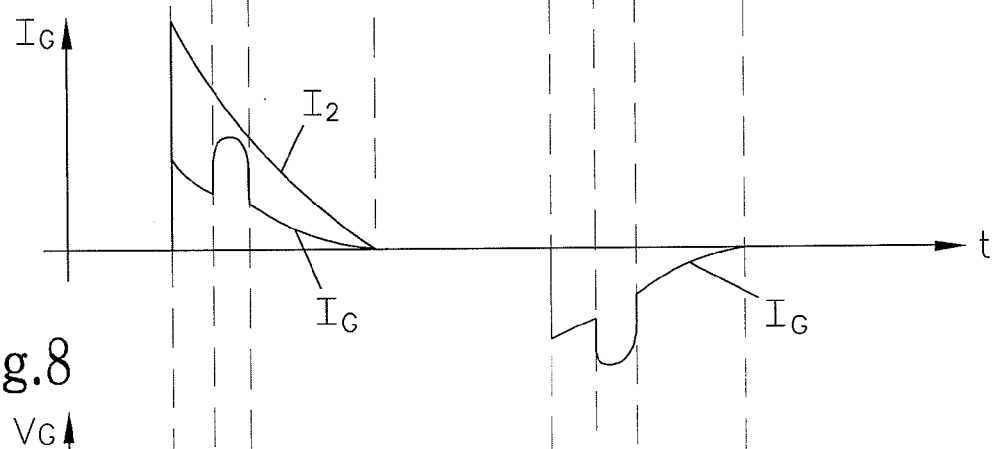

The sharp-edged driver control voltage $V_S$ of the gate driver 3 is applied to the input terminal 12 of the ramp generation unit 5 (FIG. 5), and an input current $I_2$ flows into the ramp generation unit 5 from the gate driver 3. Thus, the driver control voltage $V_S$ is also applied to the RC charging circuit 13, which is connected to the input terminal 12, whereby the capacitor C1 thereof is charged (voltage $V_R$) until the voltage levels are matched (FIG. 5). The ascending voltage $V_R$ via the capacitor C1, which is applied to the transistor control terminal B of the transistor T1, controls the PNP-type transistor T1, resulting in a current $I_1$ that descends in the form of a ramp via the transistor T1 (FIG. 6). The transistor current $I_1$ via the transistor T1 branches off from the output terminal 11 of the ramp generation unit 5, which causes the difference from the input current $I_1$ and the transistor current $I_1$ to result in the output current $I_G$ of the ramp generation unit 5, i.e., $I_G=I_2-I_1$. The current via the RC charging circuit 13 is disregarded here. Thus, a transistor control voltage $V_G$ having a flat ascending edge in the form of a ramp is applied to the control terminal 6 at the semiconductor switching element 1 through the output current $I_G$, which descends in the form of a ramp, and (where applicable) at the gate resistor $R_G$. The sharply ascending edge of the driver control voltage $V_S$ has thus been flattened to the form of a ramp by the ramp generation unit 5. Appropriate dimensioning of the RC charging circuit 13 makes it possible to precisely tune this effect.

Figure 8:
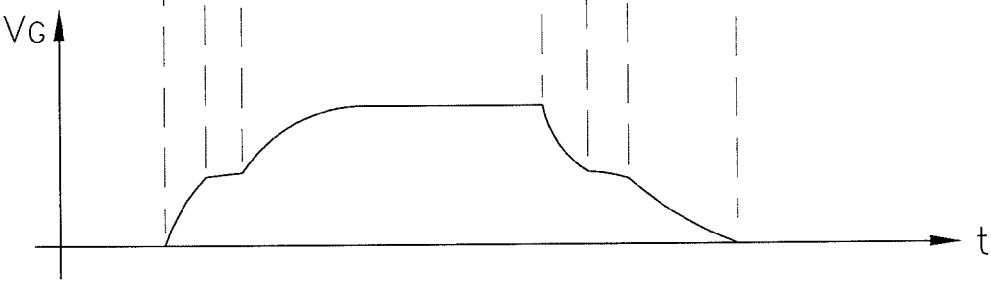

The ramp generation unit 5 thus seeks to generate a strictly monotonically ascending transistor control voltage $V_G$. The current peaks or dips in the current patterns of the transistor current $I_1$ (FIG. 6) and of the output current $I_G$ (FIG. 7) are a consequence of the well-known Miller effect in the semiconductor switching element 1. Also, the Miller effect brings about a temporary flattening of the ascending and descending edges of the transistor control voltage $V_G$ (FIG. 8).

Analogously, the sharply descending edges of the driver control voltage $V_S$ of the gate driver 3 are flattened by the ramp generation unit 5, as depicted also in FIGS. 5 to 8. The descending transistor current $I_1$ is then again branched off from the output stream $I_G$, resulting in flattening of the descending edges of the transistor control voltage $V_G$ into the form of a ramp.

Figure 9:
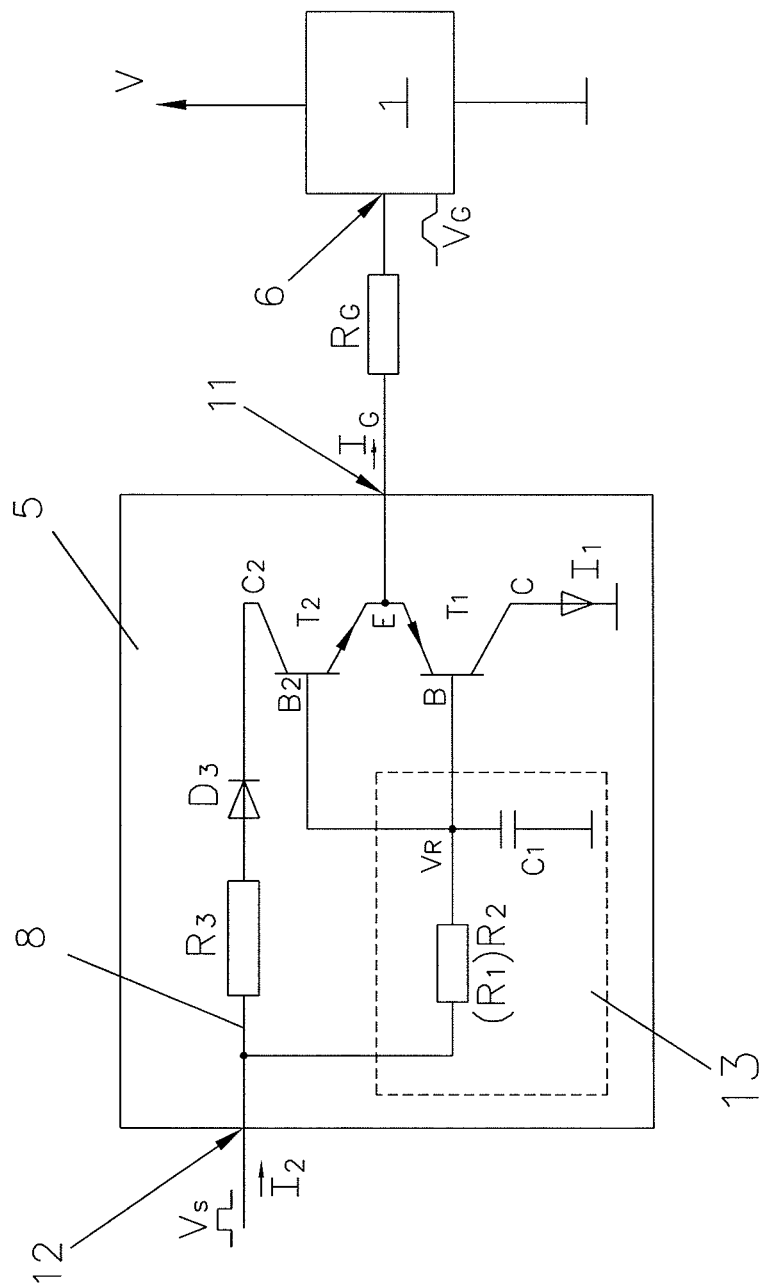
FIG. 9 illustrates another embodiment of the ramp generation unit according to the invention.
Figure 10:
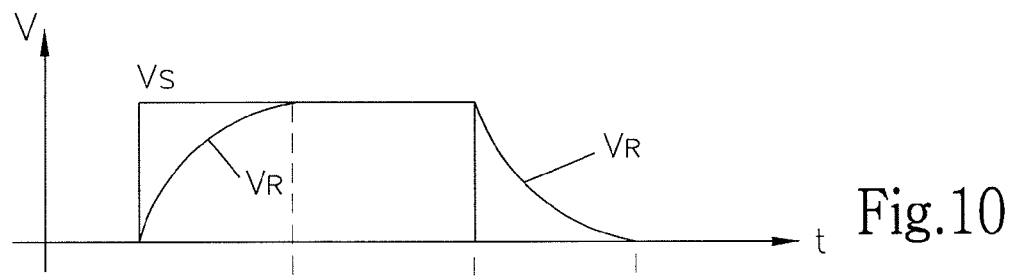
FIGS. 10 to 14 illustrate curves of characteristic currents and voltages of this ramp generation unit.
Figure 11:
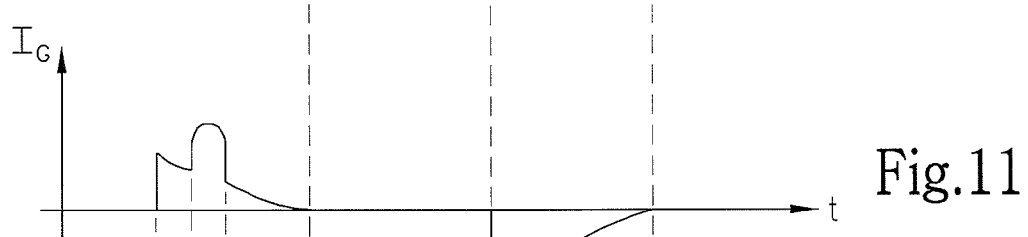
Figure 12:
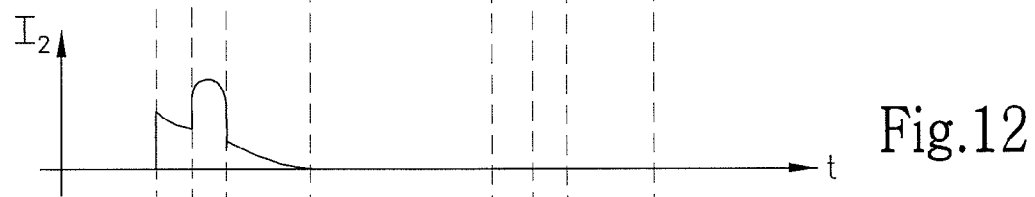
Figure 13:
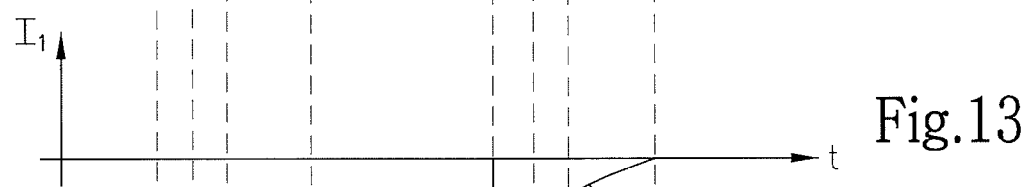
Figure 14:
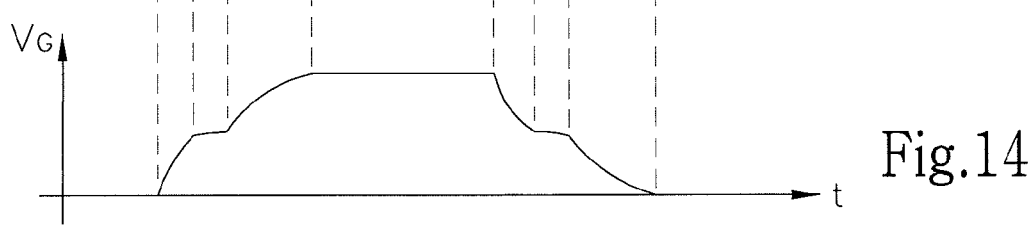

FIG. 9 illustrates a modification of the ramp generation unit 5 according to the invention. Here, the transistor T1 is still connected by the transistor output terminal E to the output 11 of the ramp generation unit 5. The input terminal 12, however, is no longer directly connected to the line 8 here to the output terminal 11, optionally via a resistor R3 and diode D3. A second transistor T2 having a polarity inverse to that of the transistor T1 (the second transistor T2 here being of the NPN-type), is connected to the transistor output terminal E of the first transistor T1, and the transistor input terminal C2 of the second transistor T2 is connected to the line 8. The transistor control terminal B2 of the second transistor T2 is connected to the transistor control terminal B of the first transistor T1, whereby the RC charging circuit 13 with the voltage $V_R$ is applied also at the transistor control terminal B2 of the second transistor T2.

The effect of this circuit is identical to that of the above-described embodiment of the ramp generation unit 5 according to FIG. 2 or 3, and the voltage edges of the driver control voltage $V_S$ are again flattened in the form of a ramp, as depicted in particular in FIGS. 10 to 14.

The only difference is that now the ascending ramp-shaped edge of the transistor control voltage $V_G$ is generated by the second transistor T2, and the descending ramp-shaped edge of the transistor control voltage $V_G$ is generated by the first transistor T1.

The advantage of this circuit according to FIG. 9 is that the standard gate driver 3 of this circuit is less burdened because for the ascending edge, as the output current $I_G$ is equal to the input current $I_2$, which also corresponds to the current via the second transistor T2. This advantage does, however, come at the cost of an additional component in the form of the second transistor T2.

It is noted that the foregoing examples have been provided merely for the purpose of explanation and are in no way to be construed as limiting of the present invention. While the present invention has been described with reference to an exemplary embodiment, it is understood that the words which have been used herein are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A circuit arrangement for controlling a semiconductor switching element having a control terminal and an output terminal, the circuit arrangement comprising:
   a gate driver, which is configured to generate a sharp-edged driver control voltage ($V_S$) having sharply ascending and descending edges for the semiconductor switching element and is connected to the control terminal of the semiconductor switching element;
   a ramp generation unit, which is arranged to connect the control terminal of the semiconductor switching element to the output terminal of the semiconductor switching element and to generate a transistor control voltage ($V_G$) at an output of the ramp generation unit, in which the sharply ascending and descending edges of the driver control voltage ($V_S$) are flattened into a ramp form;
   the gate driver being configured to supply power to the ramp generation unit; and
   a transistor arranged at an output side of the ramp generation unit, the transistor being controlled by a voltage ($V_R$) that ascends or descends in the form of a ramp, whereby a transistor current ($I_1$) descending or ascending in a ramp form flows via the transistor.

2. The circuit arrangement according to claim 1, further comprising a signal transformer connected between the gate driver and the ramp generation unit.

3. A circuit arrangement for controlling a semiconductor switching element having a control terminal and an output terminal, the circuit arrangement comprising:
   a gate driver, which is configured to generate a sharp-edged driver control voltage ($V_S$) having sharply ascending and descending edges for the semiconductor switching element and is connected to the control terminal of the semiconductor switching element;
   a ramp generation unit, which is arranged to connect the control terminal of the semiconductor switching element to the output terminal of the semiconductor switching element and to generate a transistor control voltage ($V_G$) at an output of the ramp generation unit, in which the sharply ascending and descending edges of the driver control voltage ($V_S$) are flattened into a ramp form; and
   the gate driver being configured to supply power to the ramp generation unit,
   wherein the ramp generation unit further comprises a first transistor and an RC charging circuit comprising a resistor and a capacitor, and
   wherein an output terminal of the first transistor is connected to an output terminal of the ramp generation unit, the RC charging circuit is connected to an input terminal of the ramp generation unit via the resistor, and the capacitor of the RC charging circuit is connected to the transistor control terminal of the first transistor.

4. A circuit arrangement for controlling a semiconductor switching element having a control terminal and an output terminal, the circuit arrangement comprising:
   a gate driver, which is configured to generate a sharp-edged driver control voltage ($V_S$) having sharply ascending and descending edges for the semiconductor switching element and is connected to the control terminal of the semiconductor switching element;
   a ramp generation unit, which is arranged to connect the control terminal of the semiconductor switching element to the output terminal of the semiconductor switching element and to generate a transistor control voltage ($V_G$) at an output of the ramp generation unit, in which the sharply ascending and descending edges of the driver control voltage ($V_S$) are flattened into a ramp form; and
   the gate driver being configured to supply power to the ramp generation unit,
   wherein the ramp generation unit further comprises a first transistor, a second transistor, and an RC charging circuit comprising a resistor and a capacitor, and
   wherein respective output terminals of the first transistor and of the second transistor are connected to one another and to an output terminal of the ramp generation unit; the transistor control terminal of the second transistor is connected to the input terminal of the ramp generation unit; the RC charging circuit is connected to the input terminal of the ramp generation unit via the resistor; and the capacitor of the RC charging circuit is connected to the transistor control terminal of the first transistor and of the second transistor.

5. A method for controlling a semiconductor switching element comprising:
   generating, via a gate driver, a sharp-edged driver control voltage ($V_S$) to a control terminal of the semiconductor switching element;
   supplying, from the gate driver, power and an input current ($I_2$) to the ramp generation unit;
   generating a ramp-shaped output current ($I_G$) of the ramp generation unit by branching a ramp-shaped current ($I_1$) off from the input current ($I_2$) in the ramp generation unit;
   supplying the ramp-shaped output current ($I_G$) into the control terminal of the semiconductor switching element, which results in a transistor control voltage ($V_G$) having edges that ascend and descend in a ramp form;
   applying the driver control voltage ($V_S$) in the ramp generation unit to an RC charging circuit; and
   applying a voltage ($V_R$), which is applied to a capacitor of the RC charging circuit, to a transistor control terminal of a transistor to control the transistor, so that the ramp-shaped current ($I_1$) flows via the transistor.

6. The method according to claim 5, further comprising:
   applying the voltage ($V_R$) at the capacitor of the RC charging circuit to respective transistor control terminals of two series connected transistors, wherein the transistors are connected to one another and to the control terminal of the semiconductor switching element via the respective transistor output terminals thereof.

* * * * *